United States Patent
Sudak et al.

(10) Patent No.: US 7,502,155 B2
(45) Date of Patent: Mar. 10, 2009

(54) ANTIREFLECTIVE COATING FOR SEMICONDUCTOR DEVICES AND METHOD FOR THE SAME

(75) Inventors: Paul G. Sudak, Lucas, TX (US); Robert L. Adams, Plano, TX (US); Jason M. Neidrich, Allen, TX (US); Simon Joshua Jacobs, Lucas, TX (US); Lisa Ann Wesneski, The Colony, TX (US); Linda M. Wills, Rowlett, TX (US); William D. Carter, Allen, TX (US); Judith C. Frederic, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 195 days.

(21) Appl. No.: 11/080,727

(22) Filed: Mar. 15, 2005

(65) Prior Publication Data

US 2006/0209386 A1 Sep. 21, 2006

(51) Int. Cl.
 *G02F 1/03* (2006.01)
 *G02F 1/07* (2006.01)
 *G02F 1/29* (2006.01)
 *G02B 26/00* (2006.01)
 *G02B 26/08* (2006.01)

(52) U.S. Cl. .................. 359/248; 359/291; 359/292; 359/298

(58) Field of Classification Search ........... 359/291, 359/290, 292, 295, 298, 248, 245, 263, 584; 290/291, 292, 295, 298, 248, 245, 263, 584
See application file for complete search history.

(56) References Cited

U.S. PATENT DOCUMENTS 5,671,083 A  9/1997 Conner et al.
6,282,010 B1  8/2001 Sulzbach et al.
6,326,123 B1 *  12/2001 West et al. .............. 430/270.1
6,326,231 B1  12/2001 Subramanian et al.
2006/0092497 A1 *  5/2006 Duncan .................. 359/321

OTHER PUBLICATIONS

Nguyen, H.V., et al., "Evoloution of the Optical Functiuns of Thin-Film Aluminum: A real-Time Spectroscopic Ellipsometry Study", The American Physical Society, vol. 47, No. 7, pp. 3947-3965, Feb. 15, 1993.

(Continued)

*Primary Examiner*—Scott J Sugarman
*Assistant Examiner*—Brandi N Thomas
(74) *Attorney, Agent, or Firm*—Dawn V. Stephens; Wade J. Brady, III; Frederick J. Telecky, Jr.

(57) ABSTRACT

According to one embodiment of the present invention, a semiconductor device includes a first layer of dielectric material disposed upon an upper surface of a substrate of a semiconductor device and a first non-conductive layer of metal disposed upon an upper surface of the dielectric material. The first layer of dielectric material and the first non-conductive layer of metal act as an optical trap for electromagnetic radiation received by the first non-conductive layer of metal. In particular embodiments, the semiconductor device may further comprise a second layer of dielectric material disposed upon an upper surface of the first non-conductive layer of metal and a second non-conductive layer of metal disposed upon an upper surface of the second layer of dielectric material.

20 Claims, 2 Drawing Sheets

OTHER PUBLICATIONS

B. Abeles, H. L. Pinch and J. I. Gittleman; "Percolation Conductivity in W-Al2 O3 Granular Metal Films" RCA Laboratories, Princeton, New Jersey 08540; (Received May 12, 1975) (pp. 247-250).

Thomas W. H. Oates, "Metal Plasma Immersion Ion Implantation and Deposition Using Polymer Substrates" University of Sydney, Physics, Mar. 27, 2006, University of Sydney, Physics (pp. 115-141).

* cited by examiner

ANTIREFLECTIVE COATING FOR SEMICONDUCTOR DEVICES AND METHOD FOR THE SAME

TECHNICAL FIELD

This invention relates in general to semiconductor devices and, more particularly, to an antireflective coating for semiconductor devices and a method for the same.

BACKGROUND

Semiconductor devices may be designed to interact with electromagnetic radiation that is incident upon a particular area of the device. One such semiconductor device is a spatial light modulator, which serves to redirect the path of incoming radiation by action of one or more accepted principles of optics, such as reflection, refraction, or diffraction. Unfortunately, in many of these devices, some incident radiation may not be redirected in the desired manner due to physical gaps, unwanted diffraction, scattering effects, or other phenomena. Such radiation may be deemed "stray radiation." This stray radiation may degrade the performance of the overall system if a mechanism of absorbing the radiation is not present.

An example of a spatial light modulator whose performance may be degraded by stray radiation is a digital micromirror device (DMD). DMDs, which may be used in a variety of optical communication and/or projection display systems, involve an array of micro-mirrors that selectively communicate at least a portion of an optical signal or light beam by pivoting between active "on" and "off" states. To permit the micro-mirrors to pivot, each micro-mirror is attached to a hinge coupled to a CMOS substrate that controls the movement of the micro-mirrors. Unfortunately, when the micro-mirrors are in the "off" state, the CMOS substrate, which may be optically reflective, is exposed. As light passes between the micro-mirrors of the DMD, the light may then be reflected by the surface of the substrate, resulting in stray radiation that limits the contrast ratio achievable in display systems based on the DMD.

A variety of methods have been employed in an attempt to reduce the reflectivity of the CMOS substrate that makes up the substructure of DMDs and other spatial light modulators. One such method that has been employed is the application of an antireflective and/or absorptive coating to certain regions of the semiconductor device which are physically located on a different plane than the surface(s) responsible for the redirection effects. These coatings, however, are limited in that they may require complicated materials and may not absorb sufficiently within the frequency range of interest to provide the best possible system performance. Additionally, some of these coatings require patterning over the substrate due to optical or electrical performance issues.

SUMMARY OF THE INVENTION

According to one embodiment of the present invention, a semiconductor device comprises a first layer of dielectric material disposed upon an upper surface of a substrate of a semiconductor device and a first non-conductive layer of metal disposed upon an upper surface of the dielectric material. The first layer of dielectric material and the first non-conductive layer of metal act as an optical trap for electromagnetic radiation incident upon the first non-conductive layer of metal. In particular embodiments, the semiconductor device may further comprise a second layer of dielectric material disposed upon an upper surface of the first non-conductive layer of metal and a second non-conductive layer of metal disposed upon an upper surface of the second layer of dielectric material.

A technical advantage of some embodiments of the present invention includes a semiconductor device having a lower level of electromagnetic radiation reflected from the underlying layers. Spatial light modulators thus constructed may result in systems with improved contrast ratios when compared to systems prepared with conventional semiconductor devices. Unlike conventional semiconductor devices, semiconductor devices in accordance with one embodiment of the present invention utilize an optical trap comprising thin layers of dielectric material and very thin layers of metal to reduce the reflectivity of the substrate of the device. Thus, when electromagnetic radiation, is received by the substrate of the device, the radiation is at least partially trapped by the thin layers of metal and dielectric material, rather than resulting in an unwanted reflection that may be visible in an optical signal or light beam being produced by the device.

Another technical advantage of some embodiments of the present invention includes an antireflective coating for semiconductor devices that may be applied using common semiconductor manufacturing materials and techniques. These materials require little in the way of special handling and help to reduce the cost of the resulting semiconductor devices. In particular embodiments, the dielectric and thin metal films may even be deposited with no patterning requirement for the combination of dielectric and thin metal. The materials may also fail to pose environmental concerns. Furthermore, these materials are well-known in the art, and their behaviors in the resulting devices are well understood.

Yet another technical advantage of some embodiments of the present invention includes the ability to tune the response of the antireflective coatings of the present invention for different regions of the electromagnetic spectrum. Given an electromagnetic frequency range of interest, particular embodiments may optimize the thicknesses of the dielectric and thin metal films to selectively absorb the desired frequency range using a self-consistent, iterative optical interference model.

Other technical advantages of the present invention may be readily apparent to one skilled in the art from the following figures, descriptions, and claims. Moreover, while specific advantages have been enumerated above, various embodiments may include all, some, or none of the enumerated advantages.

BRIEF DESCRIPTION OF THE DRAWINGS

For a more complete understanding of the present invention and features and advantages thereof, reference is now made to the following description, taken in conjunction with the accompanying drawings, in which.

DESCRIPTION OF EXAMPLE EMBODIMENTS

In accordance with the present invention, an antireflective coating for use in semiconductor devices and a method for the same are provided. Generally, the antireflective coating comprises a first layer of dielectric material disposed upon an upper surface of a substrate, and a first non-conductive layer of metal disposed upon an upper surface of the dielectric material. The first layer of dielectric material and the first non-conductive layer of metal act as an optical trap for electromagnetic radiation incident upon the device. Such an antireflective coating may be utilized in a semiconductor device, such as a spatial light modulator, variable diffraction grating, liquid crystal light valve, digital micro-mirror device, or other semiconductor device, to reduce the effects of stray radiation on the performance of the device. An example of one such device is digital micro-mirror device (DMD) 100, illustrated in FIG. 1.

Figure 1:
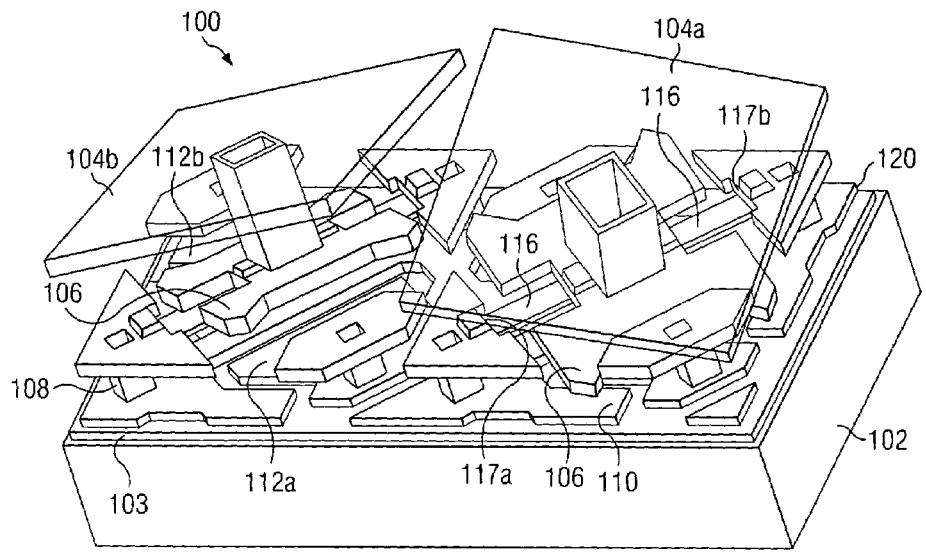
FIG. 1 illustrates a perspective view of a portion of an example semiconductor device in accordance with a particular embodiment of the present invention.

In accordance with a particular embodiment of the present invention, FIG. 1 illustrates a perspective view of a portion of digital micro-mirror device 100. DMD 100 employs an ultra-thin metal coating over the substrate of the DMD to reduce the reflectivity of the underlying substrate and improve the contrast of the DMD. In particular embodiments, this ultra-thin metal coating comprises aluminum or aluminum oxides.

As shown in FIG. 1, DMD 100 comprises a micro electromechanical switching (MEMS) device that includes an array of hundreds of thousands of tilting micro-mirrors 104. In this example, each micro-mirror 104 is approximately 13.7 square microns in size and has an approximately one micron gap between adjacent micro-mirrors. In some examples, each micro-mirror can be less than thirteen square microns in size. In other examples, each micro-mirror can be approximately seventeen square microns in size. In addition, each micro-mirror 104 may tilt up to plus or minus ten degrees creating an active "on" state condition or an active "off" state condition. In other examples, each micro-mirror 104 may tilt plus or minus twelve degrees for the active "on" state or "off" state.

In this example, each micro-mirror 104 transitions between its active "on" and "off" states to selectively communicate at least a portion of an optical signal or light beam. To permit micro-mirrors 104 to tilt, each micro-mirror 104 is attached to one or more hinges 116 mounted on hinge posts 108, and spaced by means of an air gap over a complementary metal-oxide semiconductor (CMOS) substrate 102. In this example, micro-mirrors 104 tilt in the positive or negative direction until yoke 106 contacts conductive conduits 110. Although this example includes yoke 106, other examples may eliminate yoke 106. In those examples, micro-mirrors 104 tilt in the positive or negative direction until micro-mirrors 104 contact a mirror stop (not explicitly shown).

In this particular example, electrodes 112 and conductive conduits 110 are formed within a conductive layer 120 disposed outwardly from an oxide layer 103. Conductive layer 120 can comprise, for example, an aluminum alloy or other suitable conductive material. Oxide layer 103 operates to insolate CMOS substrate 102 from electrodes 112 and conductive conduits 110.

Conductive layer 120 receives a bias voltage that at least partially contributes to the creation of the electrostatic forces developed between electrodes 112, micro-mirrors 104, and/or yoke 106. In this particular example, the bias voltage comprises a steady-state voltage. That is, the bias voltage applied to conductive layer 120 remains substantially constant while DMD 100 is in operation. In this example, the bias voltage comprises approximately twenty-six volts. Although this example uses a bias voltage of twenty-six volts, other bias voltages may be used without departing from the scope of the present disclosure.

In this particular example, CMOS substrate 102 comprises the control circuitry associated with DMD 100. The control circuitry can comprise any hardware, software, firmware, or combination thereof capable of at least partially contributing to the creation of the electrostatic forces between electrodes 112, micro-mirrors 104, and/or yoke 106. The control circuitry associated with CMOS substrate 102 functions to selectively transition micro-mirrors 104 between "on" state and "off" state based at least in part on data received from a processor (not explicitly shown).

In this particular example, micro-mirror 104a is positioned in the active "on" state condition, while micro-mirror 104b is positioned in the active "off" state condition. The control circuitry transitions micro-mirrors 104 between "on" and "off" states by selectively applying a control voltage to at least one of the electrodes 112 associated with a particular micro-mirror 104. For example, to transition micro-mirror 104b to the active "on" state condition, the control circuitry removes the control voltage from electrode 112b and applies the control voltage to electrode 112a. While FIG. 1 illustrates a particular DMD device, FIG. 1 and its associated description are provided for illustrative purposes only and should in no way be read to limit the scope of the present disclosure. Rather, it should recognized that the teachings of the present invention may be used to reduce the amount of light reflected by a DMD substrate or any other semiconductor device.

As mentioned above, when micro-mirrors 104 are in the "off" state, CMOS substrate 102 may be exposed as the tilting of the mirrors reveals the substrate below. In conventional DMDs, this would result in an unwanted reflection, visible between the pixels of the optical signal or image produced by the DMD. However, DMD 100 features an optical trap comprising thin-film structures (not explicitly shown) on the upper surface of CMOS substrate 102 to decrease unwanted stray light reflections from said substrate. A better understanding of this thin-film optical trap may be had by making reference to FIG. 2.

Figure 2:
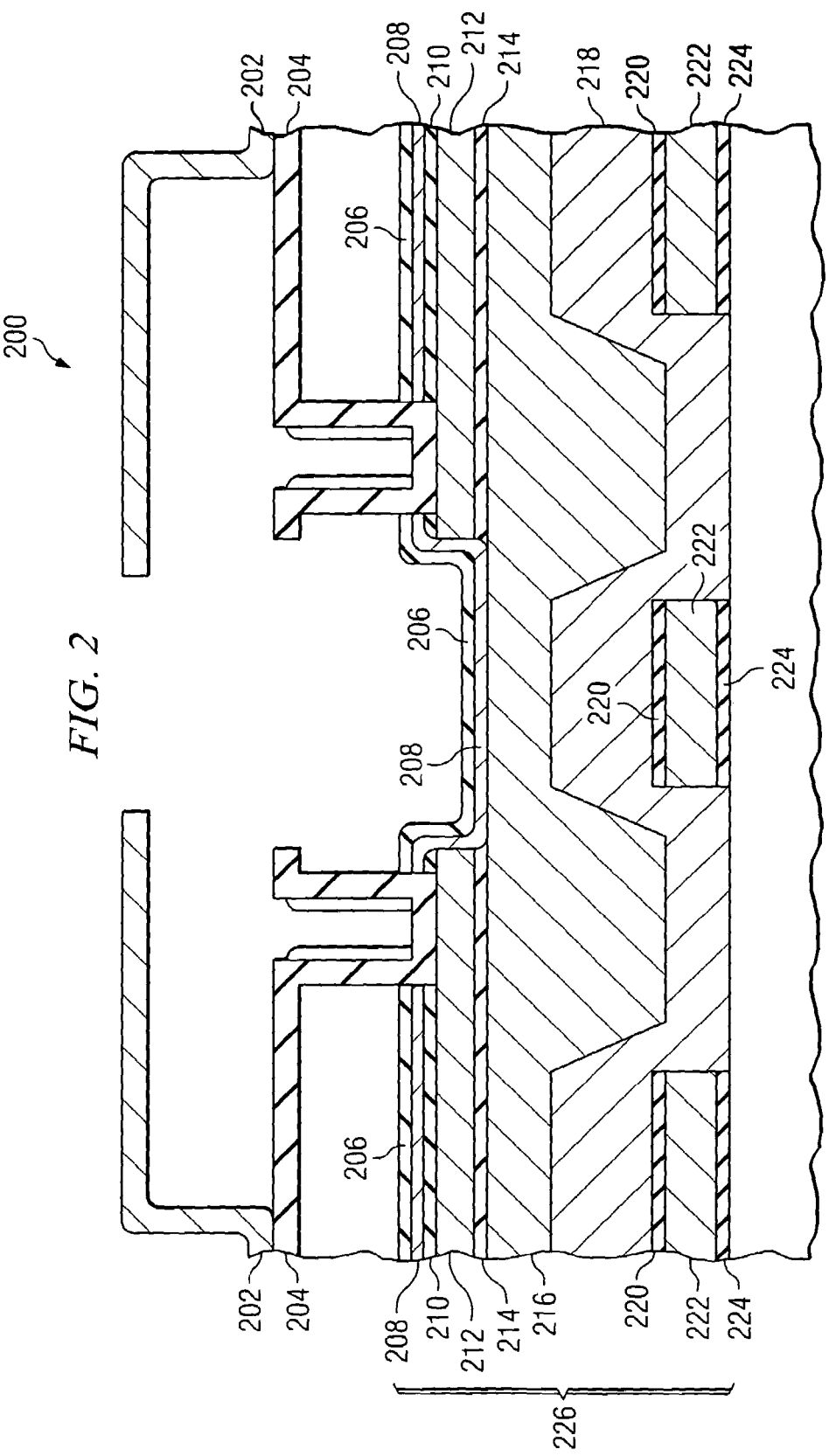
FIG. 2 illustrates a cross-sectional view of a portion of the semiconductor device of FIG. 1 in accordance with a particular embodiment of the present invention.

FIG. 2 illustrates a cross-sectional view of a portion of DMD 200 in accordance with a particular embodiment of the present invention. As shown in FIG. 2, DMD 200 comprises micro-mirrors 202, hinges 204, and CMOS substrate 226. Similar to the embodiments previously discussed, each micro-mirror 202 transitions between its active "on" and "off" states to selectively communicate at least a portion of an optical signal or light beam. To permit micro-mirrors 202 to tilt, each micro-mirror 202 is attached to one or more hinges 204 mounted on, and spaced by means of an air gap over, substrate 226.

Generally, substrate 226 comprises multiple layers of metals and dielectric materials that comprise the control circuitry associated with DMD 200. This control circuitry can comprise any hardware, software, firmware, or combination thereof capable of at least partially contributing to the creation of the electrostatic forces used to selectively transition micro-mirrors 202 between "on" state and "off" state based at least in part on data received from a processor (not explicitly shown).

As shown in FIG. 2, substrate 226 comprises metal layers 222 and 212, also known as "Metal 2" and "Metal 3," respectively. Although not illustrated in FIG. 2, below these layers is an additional metal layer, "Metal 1." Each of metal layers 222 and 212 is coupled to a lower layer of Ti/TiN and an upper layer of TiN designated as Arc-TiN. Thus, metal layer 222 is layered between Ti/TiN layer 224 and Arc-TiN layer 220, while metal layer 212 is layered between Ti/TiN layer 214 and Arc-TiN layer 210. Between "Metal 2" and "Metal 3" and their associated Ti/TiN and Arc-TiN structures are dielectric layers 216 and 218, comprising TEOS oxide and HDP oxide, respectively, which act to electrically isolate "Metal 2" and "Metal 3" from each other. Of course, this particular structural arrangement and these particular materials are presented for illustrative purposes only. As would be understood by one of ordinary skill in the art, a substrate of a digital micro-mirror device could comprise other structures or materials of construction without deviating from the teachings of the present invention.

With multiple layers of highly reflective metals and dielectric material comprising part of the CMOS substrate of a DMD, the surface of the CMOS substrates of DMDs are typically optically reflective. To help reduce this reflectivity, substrate 226 further comprises thin metal layer 206 and dielectric layer 208, which together operate as an optical trap on the upper surface of CMOS substrate 226. When micro-mirrors 202 tilted in the "off" state, electromagnetic radiation, such as visible light, may pass between the mirrors. This radiation passes between micro-mirrors 202, through thin metal layer 206 and dielectric layer 208, and is then reflected off the upper surface of Arc-TiN layer 210. In conventional DMD devices lacking layers 206 and 208, this stray radiation would then be reflected back between micro-mirrors 202 creating an unwanted visible artifact. However, in DMDs (or other semiconductor devices) in accordance with the teachings of the present invention, the presence of the additional layers taught here provides destructive optical interference within and at the boundaries of the thin-film structures. Said destructive interference serves to lessen the intensity of the light reflected by the substrate as compared to devices without said layers. Particular embodiments of the present invention may also comprise a controlled cap oxide layer on top of the thin metal layer 206.

Generally, any metal suitable for use in semiconductor manufacturing may be employed in the thin metal layers (or films) of the present invention. As would be known to one of ordinary skill in the art, upon exposure to a normal room temperature environment, such thin metal films may incorporate oxygen and other elements due to auto-oxidation. Therefore, the thin metal layers may comprise pure metal or metal admixed with one or more of its own oxides. In particular embodiments, the thin metal layer comprises aluminum or aluminum oxide, although other metals (or metal/metal oxide mixtures) are also suitable for use in the present invention. The thin metal films of the present invention may be deposited by any suitable physical or chemical vapor deposition technique, including, without limitation, sputtering, evaporation, cathodic arc deposition, and plasma-enhanced chemical vapor deposition.

The dielectric material of the present invention may comprise any dielectric material suitable for use in semiconductor manufacturing. Particular embodiments of the present invention may employ dark dielectrics, such as oxides, due their enhanced anti-reflective properties. An example of one suitable dielectric is silicon dioxide. The dielectric material may be deposited using any suitable dielectric deposition technique. Such suitable deposition techniques include, but are not limited to, sputtering, chemical vapor deposition, plasma-enhanced chemical vapor deposition, and spin-coating.

The nucleation and growth of ultra-thin metal films has been an area of research interest for quite some time. As would be understood by one of ordinary skill in the art, the optical and electrical properties of metal films do not achieve those of the bulk metal until the film has grown to a certain thickness known as the percolation threshold. Below the percolation threshold, the metal film comprises isolated islands of metal which may be converted by exposure to an oxidizing agent to the corresponding metal oxide. Films with very similar optical properties may be consistently produced by controlling deposition conditions as would be understood by those skilled in the art. Especially important are very short deposition times, such as in a sputtering system, to maintain the film thickness below the percolation threshold.

The optimum thicknesses of the metal and dielectric layers depend on the optical properties of the selected dielectric material and metal. Generally, the optimum thicknesses of the layers may be determined using an optical interference model of the thin films, in which a self-consistent, iterative optimization of the layer thicknesses is performed for the angles of incidence and electromagnetic frequencies of interest to the optimization. A variety of computer modeling programs commonly known in the art may be used to perform such an optimization, including WVASE32 software published by the J.A. Woollam Company, Inc., of Lincoln, Nebr. In particular embodiments, the angle of incidence of interest to the optimization is 26 degrees, although in other embodiments other angles of incidence may be of interest. As would also be understood by one of ordinary skill in the art, the optimum thickness of the dielectric material may be further constrained by the dielectric constant of the selected dielectric material.

With this information in mind, the thin films of the present invention may generally have any suitable thicknesses between zero and the percolation threshold for a continuous thin film of the metal. For example, in particular embodiments of the present invention, the first thin layer of metal may have a thickness from about 5 angstroms to about 120 angstroms, while the first layer of dielectric material may have a thickness from about 150 angstroms to about 1000 angstroms.

In particular embodiments of the present invention, additional layers of dielectric material and metal (not illustrated) may be further deposited on top of dielectric layer 208 and thin metal layer 206. The result is a thin-film stack of alternating layers of metal and dielectric material, which may further improve the contrast of the resulting DMD-based display system. When present, these optional additional layers of metal and dielectric material may also have thicknesses similar to those of the first layers of metal and dielectric.

The thicknesses discussed above are substantially below those required for conductivity and optical behavior of the bulk material. In fact, as these thicknesses, the metal/metal oxide films typically have conductivities of at most 0.0001 times that of the bulk metal. Thus, the thin metal films of the present invention may be employed in a semiconductor or other device, even covering the entire upper surface of the substrates, without compromising the electrical performance of said device (e.g., causing shorts on the surface of the substrate). Additionally, in particular embodiments, the optical traps of the present invention may be manufactured using materials already used in semiconductor manufacturing which are plentiful, easily obtained, and that have properties well-known by those of ordinary skill in the art. Furthermore, in particular embodiments, the multiple layers of the thin-film structure may also be patterned in a single photolithographic step, thus simplifying the manufacturing process.

Figure 3:
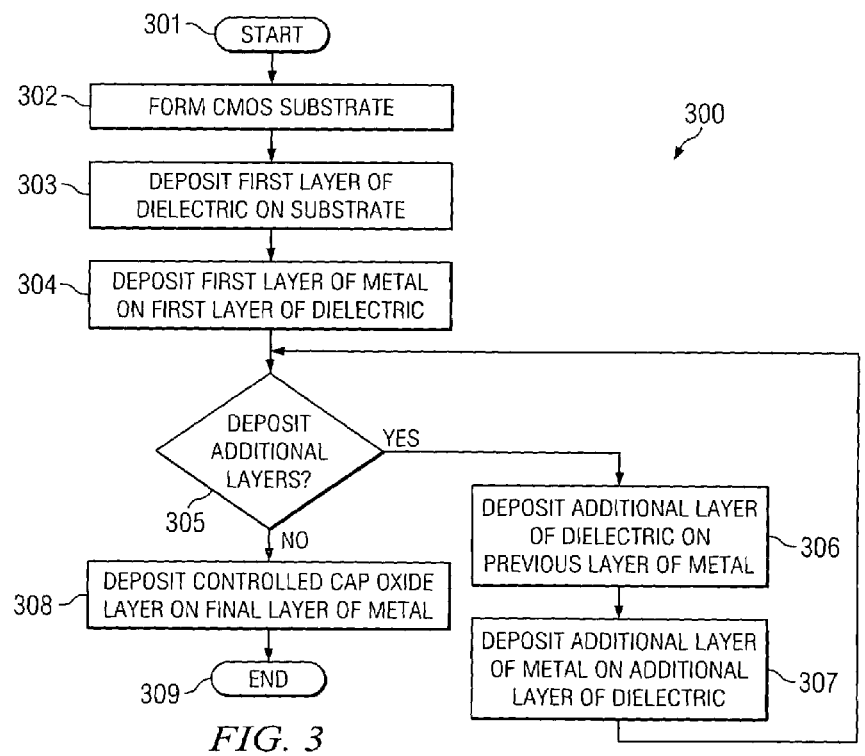
FIG. 3 illustrates a flowchart of a method of forming a semiconductor device substrate in accordance with a particular embodiment of the present invention.

A flowchart of a method of manufacturing a semiconductor device in accordance with the teachings of the present invention is illustrated in FIG. 3. As shown in FIG. 3, flowchart 300 begins in block 301. At block 302, the CMOS substrate of the semiconductor device is formed. Depending on the semiconductor device being manufactured, this may comprise a variety of different materials arranged in a variety of different structures, all falling within the teachings of the present invention. After the CMOS substrate has been formed in block 302, a first layer of dielectric material is deposited on the upper surface of the substrate in block 303. As previously discussed, this may comprise any dielectric material suitable for use in semiconductor manufacturing, including, but not limited to, oxides. A first thin metal layer, such as aluminum, is then deposited on top of the first layer dielectric material in block 304, through sputtering or some other physical vapor deposition or chemical vapor deposition technique.

In particular embodiments of the present invention, additional layers of metal and dielectric material may be deposited on the CMOS substrate to further reduce its reflectivity. Thus, in block 305 a determination is made of whether additional metal and dielectric layers are to be deposited on top of those already deposited. If additional layers are desired, an additional layer of dielectric material is deposited on the previous thin layer of metal in block 306, followed by an additional thin layer of metal in block 307. This process may be repeated until the desired number of layers have been deposited on the CMOS substrate.

Finally, once the desired number of metal and dielectric layers have been deposited on the CMOS substrate, an optional controlled cap oxide layer may be deposited on the upper surface of the final thin layer of metal in block 308, before the process terminates at block 309.

Although the above examples described the use of antireflective coatings in a digital micro-mirror device, it should be understood that the antireflective coatings of the present invention are not limited to digital micro-mirror devices. Instead, the antireflective coatings of the present invention may be suitable for use in any semiconductor device in which it is desired to reduce the effects of stray radiation, including spatial light modulators, variable diffraction gratings, liquid crystal light valves, and digital micro-mirror devices, among others.

Similarly, although particular embodiments of the method and apparatus of the present invention have been illustrated in the accompanying drawings and described in the foregoing detailed description, it will be understood that the invention is not limited to the embodiments disclosed, but is capable of numerous rearrangements, modifications, and substitutions without departing from the spirit of the invention as set forth and defined by the following claims.

What is claimed is:

1. A digital micro-mirror device having a low-reflectivity substrate, comprising:
    first and second micro-mirrors forming an aperture above a substrate;
    a layer of oxide having a thickness from about 150 angstroms to about 1000 angstroms disposed upon an upper surface of the substrate;
    a non-conductive layer of aluminum having a thickness from about 5 angstroms to about 120 angstroms disposed upon an upper surface of the layer of oxide; and
    wherein the layer of oxide and the non-conductive layer of aluminum act as an optical trap for electromagnetic radiation received through the aperture by the non-conductive layer of aluminum.

2. A semiconductor device, comprising:
    a first layer of dielectric material disposed upon an upper surface of a substrate of a semiconductor device;
    a first non-conductive layer of metal disposed upon an upper surface of the first layer of dielectric material; and
    wherein the first layer of dielectric material and the first non-conductive layer of metal act as an optical trap for electromagnetic radiation incident upon the first non-conductive layer of metal.

3. The device of claim 2, wherein the semiconductor device comprises a device selected from the group consisting of a variable diffraction grating, a digital micro-mirror device, and a liquid crystal light valve.

4. The device of claim 2, further comprising first and second mirrors forming an aperture above the substrate of the semiconductor device,
    wherein the electromagnetic radiation is received by the first non-conductive layer of metal through the aperture.

5. The device of claim 2, wherein the metal comprises aluminum or aluminum oxide.

6. The device of claim 2, wherein the dielectric material comprises an oxide.

7. The device of claim 2, wherein the first layer of dielectric material has a thickness from about 150 angstroms to about 1000 angstroms.

8. The device of claim 2, wherein the first non-conductive layer of metal has a thickness from about 5 angstroms to about 120 angstroms.

9. The device of claim 2, wherein the first non-conductive layer of metal has a thickness less than the percolation threshold for a thin film of the metal.

10. The device of claim 2, further comprising:
    a second layer of dielectric material disposed upon an upper surface of the first non-conductive layer of metal; and
    a second non-conductive layer of metal disposed upon an upper surface of the second layer of dielectric material.

11. The device of claim 10, wherein the second layer of dielectric material has a thickness from about 150 angstroms to about 1000 angstroms; and
    the second non-conductive layer of metal has a thickness from about 5 angstroms to about 120 angstroms.

12. A method for reducing stray radiation in a semiconductor device, comprising:
    allowing electromagnetic radiation to pass through a first low reflectivity, non-conducting layer of metal disposed upon an upper surface of a first layer of dielectric material, the first layer of dielectric material disposed upon an upper surface of a substrate of the semiconductor device;
    allowing the electromagnetic radiation to pass through the first layer of dielectric material;
    allowing the electromagnetic radiation to reflect off of the upper surface of the substrate; and
    at least partially reducing an amount of the electromagnetic radiation that is allowed to pass back out of the first non-conducting layer of metal.

13. The method of claim 12, wherein the semiconductor device comprises a device selected from the group consisting of a variable diffraction grating, a digital micro-mirror device, and a liquid crystal light valve.

14. The method of claim 12, wherein the semiconductor device comprises a digital micro-mirror device; and further comprising:
    allowing the electromagnetic radiation to pass through an aperture formed by a first micro-mirror and a second micro-mirror positioned above the substrate of the semiconductor device.

15. The method of claim 12, wherein the dielectric material comprises an oxide.

16. The method of claim 12, wherein the metal comprises aluminum or aluminum oxide.

17. The method of claim 12, wherein the first layer of dielectric material has a thickness from about 150 angstroms to about 1000 angstroms.

18. The method of claim 12, wherein the first non-conducting layer of metal has a thickness from about 5 angstroms to about 120 angstroms.

19. The method of claim 12, wherein the semiconductor device further comprises a second layer of dielectric material on an upper surface of the first non-conducting layer of metal and a second non-conducting layer of metal on an upper surface of the second layer of dielectric material; and further comprising:

allowing the electromagnetic radiation to pass through the second non-conducting layer of metal;

allowing the electromagnetic radiation to pass through the second layer of dielectric material; and at least partially reducing an amount of the electromagnetic radiation that is allowed to pass back out of the second non-conducting layer of metal.

20. The method of claim 19, wherein the second layer of dielectric material has a thickness from about 150 angstroms to about 1000 angstroms; and the second non-conducting layer of metal has a thickness from about 5 angstroms to about 120 angstroms.

\* \* \* \* \*